United States Patent [19]
Nabet et al.

[11] Patent Number: 5,818,863
[45] Date of Patent: Oct. 6, 1998

[54] LASER-EMITTING COMPONENT HAVING AN INJECTION ZONE OF LIMITED WIDTH

[75] Inventors: Bernard Nabet, Paris; Jean-Claude Bouley, Arcueil; Nordine Bouadma, Gentilly, all of France

[73] Assignee: France Telecom, Paris, France

[21] Appl. No.: 789,848

[22] Filed: Jan. 28, 1997

[30]    Foreign Application Priority Data

Jan. 30, 1996 [FR] France ................................ 96 01057

[51] Int. Cl.$^6$ ............................. H01S 3/19; H01S 3/08
[52] U.S. Cl. ................................ 372/46; 372/45; 372/96
[58] Field of Search .................................. 372/45, 46, 50, 372/96, 99

[56]    References Cited

U.S. PATENT DOCUMENTS

| | | | |
|---|---|---|---|
| 5,020,066 | 5/1991 | Iga et al. | 372/46 |
| 5,164,949 | 11/1992 | Ackley et al. | 372/46 |
| 5,245,622 | 9/1993 | Jewell et al. | 372/46 |
| 5,331,654 | 7/1994 | Jewell et al. | 372/45 |
| 5,343,487 | 8/1994 | Scott et al. | 372/46 |
| 5,493,577 | 2/1996 | Choquette et al. | 372/46 |
| 5,594,751 | 1/1997 | Scott | 372/46 |

OTHER PUBLICATIONS

IEEE Photonics Technology Letters, vol. 7, No. 9, 1 Sep. 1995, pp. 968–970.
Electronics Letters, vol. 31, No. 11, 25 May 1995, pp. 886–888.
Optical and Quantum Electronics, vol. 18, No. 6, Nov. 1986, pp. 403–422.
IEEE Journal of Quantum Electronics, vol. 27, No. 6, Jun. 1991, pp. 1332–1346.
Applied Physics Letters, vol. 65, No. 1, 4 Jul. 1994, pp. 97–99.
IEEE Journal of Quantum Electronics, vol. 29, No. 6, Jun. 1993, pp. 1963–1974.

(List continued on next page.)

*Primary Examiner*—Rodney B. Bovernick
*Assistant Examiner*—Quyen Phan Leung
*Attorney, Agent, or Firm*—Blakely Sokoloff Taylor & Zafman

[57]    ABSTRACT

A vertical-cavity surface-emitting laser component operating at a wavelength lying in the range 1.3 $\mu$m to 1.55 $\mu$m, the component comprising a layer of active material having an injection zone of width that is smaller than the width of the component, said zone emitting radiation when an electrical current is injected therein, the component also comprising an amplifying medium for amplifying the radiation and two mirrors that are reflective at the emission wavelength and disposed respectively above and below the amplifying medium. The amplifying medium includes a circular barrier extending facing the active material, said barrier opposing the passage of current and defining a current-passing channel in its center facing the injection zone, said channel being of a width that is smaller than the width of the injection zone.

15 Claims, 4 Drawing Sheets

OTHER PUBLICATIONS

Electronics and Communications in Japan, part 2, vol. 77, No. 2, 1994, pp. 29–37 (no month available).

Applied Physics Letters, vol. 60, No. 24, 15 Jun. 1992, pp. 2974–2976.

IEEE Journal of Quantum Electronics, vol. 29, No. 5, May 1993, pp. 1295–1308.

J. Vac. Sci. Technol. B12(2), Mar./Apr. 1994, pp. 1122–1124.

Electronics Letters, 8 Dec. 1994, vol. 30, No. 25, pp. 2138–2139.

IEEE Photonics Technology Letters, vol. 6, No. 12, Dec. 1994, pp. 1400–1402.

Journal of Crystal Growth, 127, (1993), pp. 221–225.

Regrowth of Semi–Insulating Iron Doped InP Around Reactive Ion Etched Laser Mesas in <110> and <110> Directions by Hydride Vapour Phase Epitaxy, O. Kjebon, S. Lourdudoss and J. Wallin, pp. 48–50 (no date available).

Applied Physics Letters, vol. 57, No. 26, 24 Dec. 1990, pp. 2844–2846.

Japanese Journal of Applied Physics, vol. 32, No. 3A, part 01, 1 Mar. 1993, pp. 1126/1127.

IEEE Photonics Technology Letters, vol. 7, No. 5, 1 May 1995, pp. 444–446, "Low–Threshold 1.57–$\mu$m VC–SEL's Using Strain–Compensated Quantum Wells and Oxide/Metal Backmirror" Chua et al.

LASER-EMITTING COMPONENT HAVING AN INJECTION ZONE OF LIMITED WIDTH

The invention relates to vertical cavity surface-emitting laser components that emit, and methods of fabricating such components.

BACKGROUND OF THE INVENTION

Vertical cavity surface-emitting lasers (VCSELs) provide numerous advantages over laser components that emit through the edge: it is possible to have a very low threshold current, they can be integrated two-dimensionally, coupling with an optical fiber is very simple, chips on wafers can be sorted, . . . .

Nevertheless, until now, no component has been capable of emitting on a continuous basis at an ambient temperature of less than 30° C. and at the wavelengths used for optical communications (1.3 µm or 1.55 µm). The reason is that existing components have a threshold current that is still too high due to the poor quality of current injection into the active medium.

Two parameters characterize the quality of current injection:

the area of the carrier injection zone; and the distribution of injected carriers within said zone.

For the first parameter, it is desirable to localize current injection in a clear-cut zone within the active material, limiting as much as possible any leakage of current from the active material or laterally from the defined injection zone.

To define the carrier injection zone, thereby confining the injected current, two methods are commonly employed. The first consists in defining a channel for conveying current in the p-doped semiconductor extending from the contacts to the active zone by making a circular barrier (forming lateral barriers in section) that opposes the flow of current (e.g. very high resistance implanted zones or insulating material, . . . ):

see Jack L. Jewell, J. P. Harbison, A. Scherer, Y. JL Lee, and L. T. Florez: "Vertical-cavity surface-emitting lasers: design, growth, fabrication, characterization", IEEE J. Quantum Electron., Vol. 27, No. 6, p. 1332, June 1991;

see D. L. Huffaker, D. G. Deppe, K. Kumar and T. J. Rogers: "Native-oxide defined ring contact for low threshold vertical-cavity lasers", Appl. Phys. Lett., 65 (1), p. 97, July 1994; and see R. Michalzik and K. J. Ebeling: "Modelling and design of proton-implanted ultralow-threshold vertical-cavity laser diodes", IEEE J. Quantum Electron., Vol. 29, No. 6, p. 1963, June 1993.

Nevertheless, current confinement is not very effective and high levels of lateral leakage are obtained in the active medium, since the carrier injection zone cannot be defined precisely.

The second method consists in etching the active zone to make a buried active zone of finite width, i.e. of width narrower than the width of the component, thereby preventing any lateral leakage of current, the active zone possibly being surrounded by blocking layers (of the pnpn type):

see K. Iga and S. Uchiyama: "GaInAsP/InP surface-emitting laser diode", Optical and Quantum Electron., 18 (1986), p. 403; and see T. Baba, Y. Yogo, K. Suzuki, F. Koyama, and K. Iga: "Surface-emitting lasers of low-threshold 1.3 µm GaInAsP/InP circular planar-buried heterostructure", Electron. and Commun. in Japan, Part 2, Vol. 77, No. 2, p. 29, 1994.

Nevertheless, in both cases, it is difficult to obtain satisfaction concerning the second parameter, i.e. the distribution of the injected carriers.

For the second parameter, it is necessary for the radial distribution of the injected carrier density (n) in said zone, which determines the radial distribution of gain (g) (since $g=A(n-n_0)$ to a first approximation), to provide the best possible modal gain (integral of overlap between the radial distributions of the fundamental optical mode and the gain provided by injecting carriers). In other words, that means it is necessary to inject carriers, thereby causing the active material to be amplifying material, specifically where the electromagnetic field is located.

Unfortunately, in the InP system, because it is impossible to make good Bragg mirrors out of p-doped InP semiconductor, it is necessary to make dielectric mirrors and thus to make current contacts on the sides. Likewise, with GaAs technology, it is becoming more and more frequent to use structures that include a dielectric mirror instead of a p-doped semiconductor Bragg mirror having series resistance that is much too high.

The contacts are therefore offset sideways relative to the injection zone, thereby giving rise to a high degree of variation in the radial distribution of potential in the structure, and thus raising new problems: the p/active-zone/n junction is strongly biased on the sides of the injection zone and much less biased in the center of the zone. The density of injected carriers is thus large on the sides and smaller in the center (sometimes very significantly). The same therefore applies to the radial distribution of gain, and the modal gain of the fundamental transverse mode is far from being optimized:

see H. Wada, D. I. Babic, M. Ishikawa, and J. E. Bowers: "Effects of non-uniform current injection in GaInAsP/InP vertical cavity lasers", Appl. Phys. Lett., 60 (24), p. 2974, June 1992; and see J. W. Scott, R. S. Geels, S. W. Corzine, and L. A. Goldren: "Modelling temperature effects and spatial hole burning to optimize vertical-cavity surface-emitting laser performance", IEEE J. Quantum Electron., Vol. 29, No. 5, p. 1295, 1993.

No effective method has ever really been proposed for eliminating this effect unless the p-layer is replaced by two layers: a $p^{++}$-layer diffusing the carriers towards the center, and a p-resistive layer (not too large since it raises Rs) preventing the carriers from going back towards the center. At best, the resulting injection is nearly uniform, but it is never concentrated at the center.

OBJECTS AND SUMMARY OF THE INVENTION

An object of the invention is to provide a component in which the current injection zone is well defined and in which radial distribution of carriers is such that carrier density is greater in the center than at the sides. Another object of the invention is to provide a component having modal gain that is greater than that of the above-mentioned components, and a smaller threshold current, in particular to make it possible to emit at $\lambda=1.3$ µm or 1.55 µm and at an ambient temperature lower than 30° C.

According to the invention, this object is achieved by a vertical-cavity surface-emitting laser component operating at a wavelength lying in the range 1.3 µm to 1.55 µm, the component comprising a layer of active material having an injection zone of width that is smaller than the width of the component, said zone emitting radiation when an electrical current is injected therein, the component also comprising an amplifying medium for amplifying the radiation and two mirrors that are reflective at the emission wavelength and disposed respectively above and below the amplifying medium, in which the amplifying medium includes a circular barrier extending facing the active material, said barrier opposing the passage of current and defining a current-passing channel in its center facing the injection zone, said channel being of a width that is smaller than the width of the injection zone.

The combination of an injection zone of limited width with the current passing channel defined by the facing circular barrier in the p-doped semiconductor achieves injection confinement and brings the carriers to the center of the active zone. The p/active-zone/n junction is thus more strongly biased in the center than at the sides of the injection zone, which is the opposite of what happens in the above-mentioned known components. Carrier density in the active zone is much higher in the center than at the sides. As a result, modal gain is much better than in the above-mentioned known components. This result can be modulated by varying the width of the current-passing channel defined by the circular barrier and the length of the injection zone. The component of the invention provides effective injection confinement and good distribution of the injected carriers. It thus makes to possible to reduce the threshold current and to emit at $\lambda=1.3$ $\mu$m or $1.55$ $\mu$m and at an ambient temperature of less than 30°. The component of the invention confines electrons in two ways.

For example, in an active zone of width equals 0.88 $\mu$m, the component of the invention makes it possible to obtain a threshold current of about 75 mA for reflectivity of 0.95 at the ends of the active zone, and of 15 mA for reflectivity of 0.99, whereas conventional components have a threshold current of about 155 mA and of about 30 mA under the same conditions.

The invention also provides various methods of fabricating the component of the invention.

BRIEF DESCRIPTION OF THE DRAWINGS

Other characteristics and advantages of the invention appear further on reading the following description of six embodiments of the invention given as non-limiting examples.

In the accompanying drawings.

MORE DETAILED DESCRIPTION

The six embodiments of the invention described below are vertical-cavity surface-emitting lasers operating at a wavelength $\lambda$ lying in the range 1.3 $\mu$m to 1.55 $\mu$m. These components are fabricated by a buried ridge structure (BRS) regrowth technique based on reactive ion beam etching (RIBE), commonly used for laser-emitting components that emit through the edge. To localize current in the center of the active medium, the first three embodiments make use of an ion-implanting technique, while the last three embodiments made use of a selective oxidation technique. Each component is described together with the method of making it. For greater clarity, the description relates to the fabrication of a single component, but the components are preferably fabricated on a wafer having an array of components. From one embodiment to another, the same references are used to designate layers or elements that are analogous.

First Embodiment

Figure 1A:
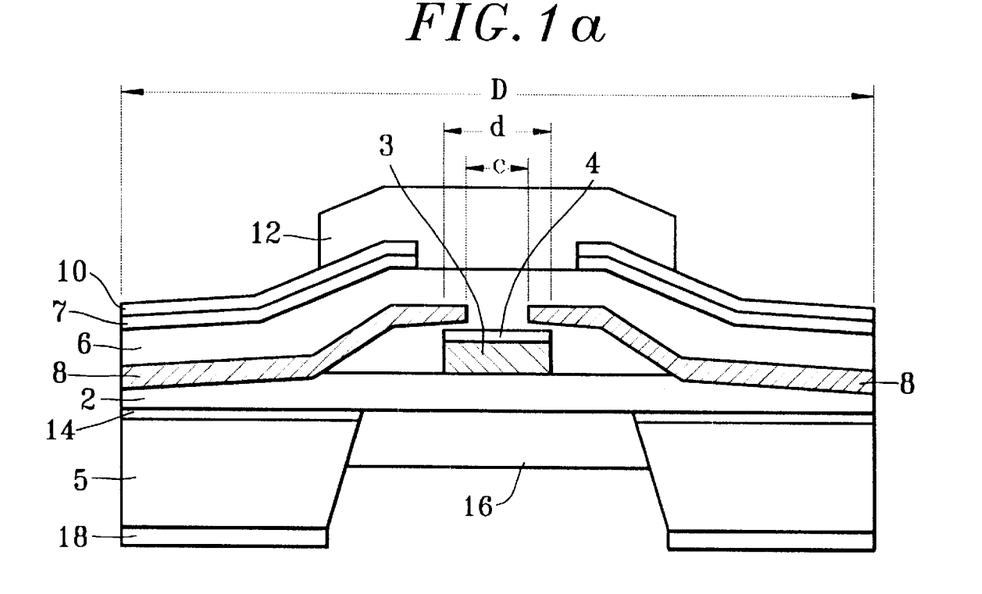
FIG. 1a is a section view through a component constituting a first embodiment of the invention.

With reference to FIG. 1, the component comprising the first embodiment is fabricated by means of a method implementing the following steps.

a) Initially a stack of three layers 2, 3, and 4 of the component is made epitaxially on a substrate 5 of n-type InP.

In a variant, these three layers may be grown epitaxially on a Bragg reflector comprising a stack of InP/InGaAsP or of AlAsSb/AlGaAsSb layers:

see D. Blum, J. I. Fritz, R. L. Dawson, J. I. Hocard, F. J. Klen, and J. T. Drummond: "MBc grown AlAsSb/GaAsSb distributed Bragg reflector lattice matched to InP operating near 1.55 micron", J. Vac. Sci. Technol., B12 (2), p. 1122, 1994 or else a stack of AlPSb/GaPSb layers:

see T. Anan, H. Shimomura, and S. Sugou: "Improved reflectivity of AlPSb/GaPSb Bragg reflector for 1.55 micron wavelength", Electron. Lett., Dec. 8, 1994, Vol. 30, p. 2138, the layers of the reflector being grown epitaxially on an InP substrate.

It is also possible to stick the layers 2, 3, and 4 onto a Bragg reflector formed by a stack of AlAs/GaAs layers growth epitaxially on a GaAs substrate:

see C. L. Chua, C. H. Lin, Z. H. Zhu, YJL Lo, M. Hong, J. P. Mannaerts, and R. Bhat: "Dielectrically-bonded long-wavelength vertical-cavity laser on GaAs substrate using strain-compensated multiple quantum wells", IEEE Photon. Tech. Lett., Vol. 6, p. 1400, December 1994.

The three layers 2, 3, and 4 make up in succession an n-type InP layer 2, an active material layer 3, and a thin p-type InP layer 4 protecting the active layer during subsequent steps of epitaxial growth or regrowth. The active material layer 3 may be formed either of solid GaInAsP as in the present case, or else as a succession of InGaAs/InGaAsP strain-compensated quantum wells:

see C. L. Chua, C. H. Lin, Z. H. Zhu, YJL Lo, M. Hong, J. P. Mannaerts, and R. Bhat: "Dielectrically-bonded long-wavelength vertical-cavity laser on GaAs substrate using strain-compensated multiple quantum wells", IEEE Photon. Tech. Lett., Vol. 6, p. 1400, December 1994.

b) The following step consists in etching the active material layer 3 and the p-doped InP layer 4 by reactive ion beam etching (RIBE) so as to form a circular mesa by the method described in French patent FR 91 0272 in the name of N. Bouadma. The width of the mesa, in this case its diameter, d is less than the width, in this case the diameter D, of the final component, i.e. less than the diameter of the stack of layers or layer portions defining the component proper, the diameter D of the component being either notional (components in an array) or real (a distinct component). In this manner, an injection zone is formed in the active material layer so as to have a diameter d that is smaller than the diameter D of the component.

c) Thereafter, during a second epitaxial growth cycle referred to as "epitaxial regrowth", a layer 6 of indium phosphide p-doped to a concentration of 1 or $2\times10^{18}$ cm$^{-3}$ is grown to cover the mesa and the layer 2. This layer 6 serves to confine laterally the carriers injected into the active mesa. Thereafter, a thin layer 7 of InGaAs highly doped with holes ($3\times10^{19}$ cm$^{-3}$) is grown epitaxially on the layer 6 to facilitate making contact with the p side of the component.

d) The following implantation step is then performed:

A photosensitive resin is deposited over the entire surface area of the component. A circular mask is positioned facing the mesa, the mask being coaxial with the mesa and of a width, in this case a diameter, smaller than the diameter d of the mesa. The sample is bombarded with H$^+$ ions at energy that is sufficiently high to create an insulating region 8 within the p-doped InP layer 6. The energy and the quantity of ions implanted must be adjusted to form the insulating region 8 in depth in the InP layer which will enable current to be injected into the center of the mesa.

This insulating region 8 is continuous within the layer 6 with the exception of the center thereof facing the mesa and the mask where the layer 6 remains conductive. This insulating layer 8 is thus in the form of a circular barrier and in section it is in the form of lateral barriers. The insulating region extends facing the active material and opposes the passage of current. In the center of the component, facing the injection zone, it defines a circular channel for passing current. Like the mask used, the width of the channel, and in this case its diameter c is less than the diameter d of the injection zone. At the end of the implantation step, the mask is removed.

e) Thereafter, a metal layer 10, e.g. of Pt and Au/Ti is deposited on the layer 7 for making p contact at the top of the component. Then, a circular opening that is coaxial with the active mesa and that has a diameter that is greater than or equal to the diameter thereof is made in the layers 7 and 10 by chemical or ion etching.

Thereafter, a Bragg reflector 12 is deposited on the top of the component in the opening, said reflector being made up of alternating SiO$_2$/Si, SiN/Si, or MgO/Si.

If the initial epitaxial growth was performed on an n-doped InP substrate, as is the case for the component shown in FIG. 1, the bottom mirror of the component is then made. For this purpose, the InP substrate 5 is then etched chemically and selectively to within a few microns of the active zone. For this purpose, it is necessary to have provided a stop layer 14 of GaInAs on the substrate 5 which is then selectively etched. Thus, a cavity is defined in the substrate with the end wall of the cavity facing the active material and being in the vicinity thereof. A dielectric mirror 16 is deposited in the cavity (the same dielectrics can be used as are used for the top mirror 12). Finally, an end contact metal layer 18 is deposited on the base of the component.

A component is thus obtained which comprises, on a substrate 5, a stack of the following successive layers:

an n-doped InP layer 2;

an active material layer 3;

a p-doped InP layer 4, with these two layers forming a mesa on the n-doped InP layer;

a p-doped InP layer 6 covering the mesa and the n-doped InP layer and including a circular barrier;

a p-doped GaInAs layer 7; and a metal contact 10, with the latter two layers having an opening facing the circular mesa on which a mirror is deposited, the component having another metal contact 18 on its bottom face.

Figure 1B:
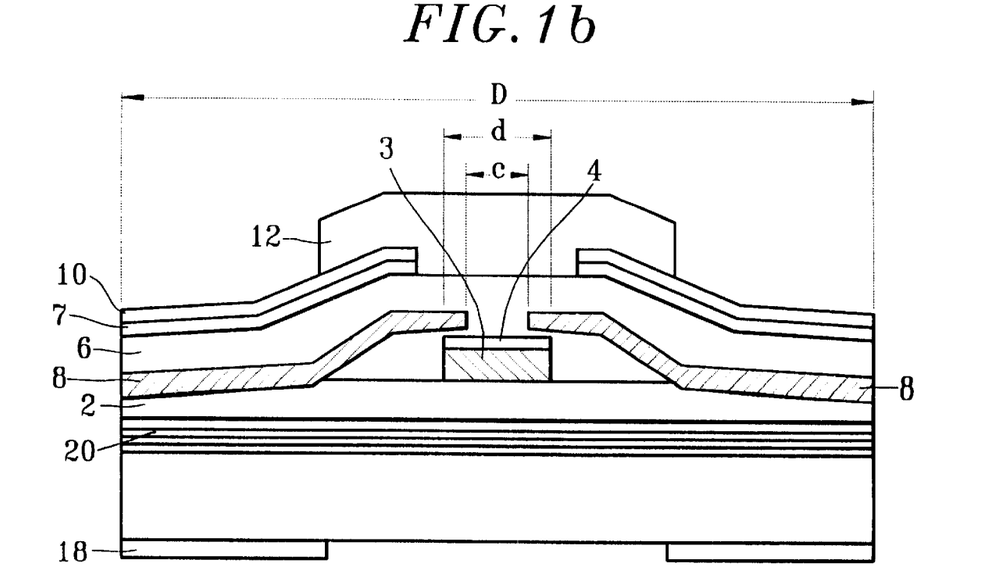
FIG. 1b is a section view through a component constituting a variant of said first embodiment.

FIG. 1b shows a variant of this embodiment of the component, in which the initial epitaxial growth is not performed on an InP substrate, but on a semiconductor Bragg mirror 20. In this case, there is no point in etching a cavity. The n-contact metal layer 18 is deposited on the base of the component over the bottom face of the mirror. The other portions of the component are identical.

A component is thus obtained comprising, on a mirror, a stack that is similar to that described above.

Second Embodiment

Figure 2:
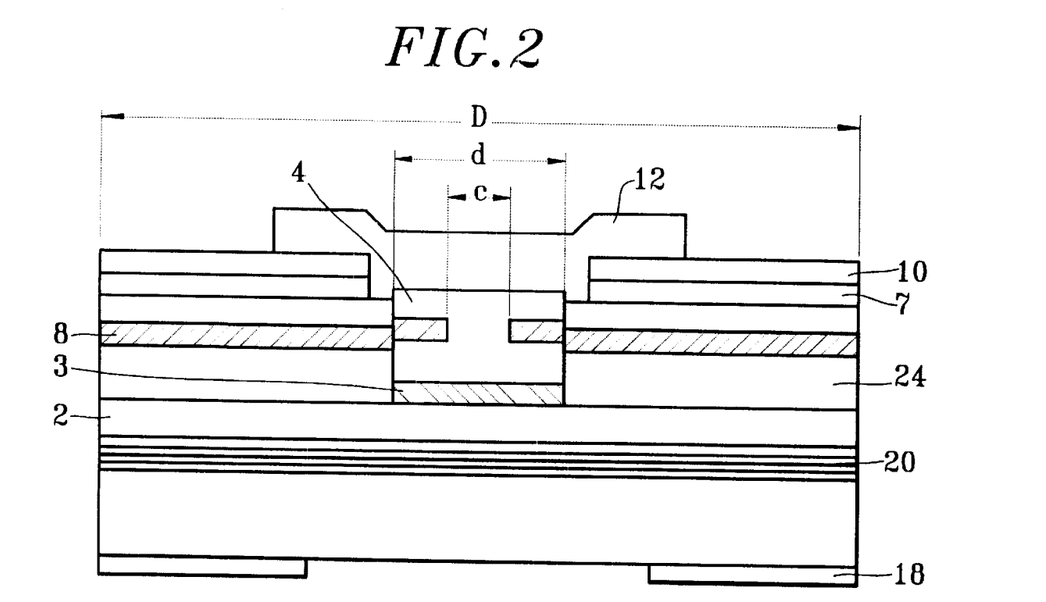
FIG. 2 is a section view of a component constituting a second embodiment of the invention.

The component comprising the second embodiment is fabricated using a method that is close to that for the first embodiment, starting from a substrate or a Bragg reflector as described at a) of the first embodiment.

In this case, the component of FIG. 2 is made on a semiconductor mirror 20.

This time four layers are grown epitaxially on the substrate or the reflector, specifically and successively: an n-doped InP layer 2; a layer 3 of GaInAsP; a p-doped InP layer 4; and finally a layer of GaInAs (not shown).

Thereafter, a circular mesa is etched as in b) above so as to give the injection zone a diameter d that is smaller than the diameter D of the component.

After which a regrowth mask is placed on the mesa to cover the top of the mesa, and a p-doped InP layer 24 is grown by localized epitaxial growth around the mesa on the n-doped InP layer 2, followed by a layer 7 of p$^+$-doped InGaAs.

Chemical molecular jet growth techniques are known (EJC):

see F. Alexandre, P. Zerguine, P. Launoy, J. L. Benchimoi, and J. Etrillard: "CBE selective embedded growth for quasi-planar GaAsIIBT application", J. Cryst. Growth, 127 (1993), p. 221 or by hydride epitaxy see O. Kjebon, S. Lourdudoss, and J. Wallin: "Regrowth of semi-insulating iron-doped InP around reactive ion-etched laser mesas in <110> and <–110> directions by hydride vapor phase epitaxy", IPRM, 1994.

Those techniques have already made it possible to achieve localized growth to a thickness of several microns by means of an appropriate mask. They would therefore appear to be entirely suitable for burying the circular mesa.

Thereafter, the regrowth mask is removed and so is the GaInAs layer covering the mesa.

An implantation step as in d) of the first embodiment is then performed. This makes a circular barrier 8 in the p-doped InP layers 4 and 24, thereby opposing the passage of electrical current and defining a central circular channel for passing current. The channel has a diameter c that is smaller than the diameter d of the mesa.

Then, as in e), a top metal layer 10 is then deposited, a top opening is made, a top dielectric mirror 12 is deposited, and a bottom metal layer 18 is deposited, possibly while also etching and depositing a bottom dielectric mirror (as in FIG. 1a).

A component is thus made comprising, on a mirror 20, a stack of the following successive layers:

an n-doped InP layer 2;

an active material layer 3;

a p-doped InP layer 4, with the latter two layers forming a mesa on the n-doped Inp layer;

a p-doped InP layer 24;

a p⁺-doped GaInAs layer 7, with the latter two layers extending around the mesa on the n-doped InP layer; and a metal contact layer 18, the GaInAs layer and the metal contact having a circular opening facing the mesa and of diameter greater than that of the mesa, a mirror being deposited thereon and the component also presenting another metal contact 18 on its bottom face, with the circular barrier 18 extending through the p-doped InP layers.

Third Embodiment

Figure 3:
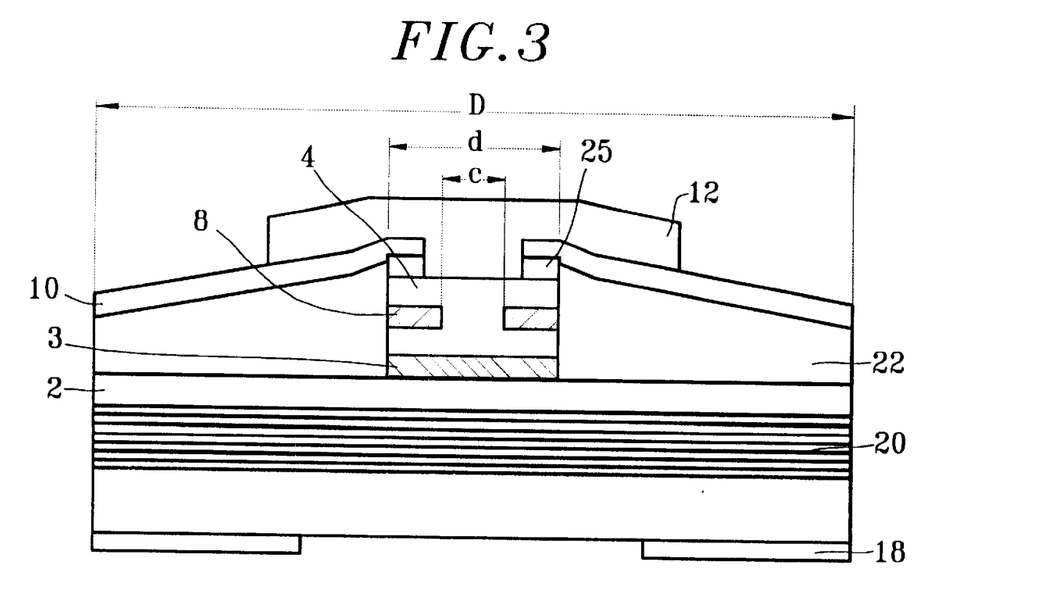
FIG. 3 is a section view of a component constituting a third embodiment of the invention.

The component comprising the third embodiment as shown in FIG. 3 is fabricated using a method close to that of the second embodiment.

The method takes place in identical manner up to and including the step of etching the mesa. The GaInAs layer on top of the mesa is visible in this case in FIG. 3, and it is given reference 25.

In this case, after the mesa has been etched, a layer of polyimide 22 is deposited on the component to cover the mesa and the n-doped InP layer 2. Thereafter, the layer 22 is reactively etched to uncover the GaInAs layer 24 on the top of the mesa.

Thereafter, an implantation step is performed in the same manner as in step d) of the first embodiment. An insulating circular barrier is thus made in the layer 4 of the mesa giving a circular channel in the center thereof for passing current. The diameter c of the channel is less than the diameter d of the mesa and of the active zone.

Then, as in step e) of the first embodiment, a top metal layer 10 is deposited, a top circular opening is formed through the layers 10 and 24, a top dielectric mirror 12 is deposited, and then a bottom metal layer 18 is deposited, optionally after etching and depositing a bottom dielectric mirror. Nevertheless, in this third embodiment, the opening etched in the layers 10 and 24 has a diameter that is smaller than the diameter d of the mesa.

This gives rise to a component that comprises, on a mirror, a stack of the following successive layers:

an n-doped InP layer 2;

an active material layer 3;

a p-doped InP layer 4 having a circular barrier extending therein;

a GaInAs layer 25, with the latter three layers forming a mesa on the n-doped InP layer;

a polyimide layer 22 extending over the n-doped InP layer around the mesa; and a metal contact 10 extending over the mesa and the polyimide layer, the GaInAs layer and the metal contact having a circular opening facing the mesa and of a diameter that is smaller than that of the mesa, with a mirror 12 being deposited thereon, the component also having another metal contact 18 on its bottom face.

Fourth Embodiment

Figure 4:
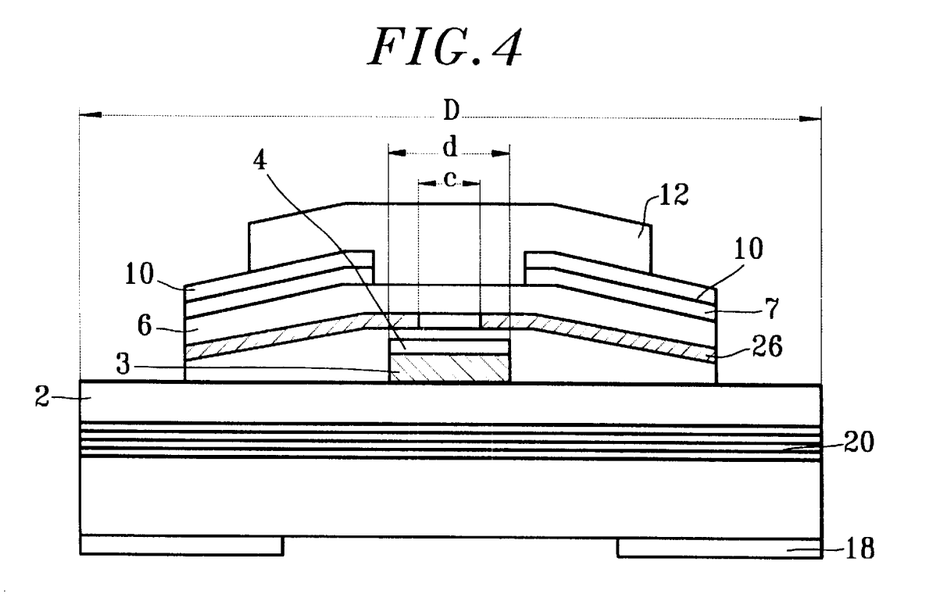
FIG. 4 is a section view of a component constituting a fourth embodiment of the invention.

The component comprising the fourth embodiment is shown in FIG. 4.

The beginning of the method for fabricating this component is the same as in the first embodiment and reproduces steps a) and b) thereof, i.e. it is the same up to and including the step of etching the mesa.

During a second epitaxial growth cycle, an InP layer 6 that is p-doped to a concentration of 1 or $2 \times 10^{18}$ cm$^{-3}$ is made covering the mesa and the n-doped InP layer 2, by interposing an additional InAlAs layer 26 in the p-doped InP layer. For this purpose, successive epitaxial growth operations are performed as follows: a first InP sublayer, the InAlAs layer, and then a second p-doped InP sublayer. Thereafter, the thin layer 7 of InGaAs is grown epitaxially thereon as in step c).

Thereafter, peripheral etching is performed on the layers 7, 6, and 26 of GaInAs, of p-doped InP, and of InAlAs at a distance from the mesa, down to the n-doped InP layer.

Selective oxidation is then performed of the InAlAs layer 26 by wet chemical etching starting from the edge of this layer as made accessible by etching. The selective oxidation technique is known and has already been used for making laser components having a wavelength $\lambda = 1.55$ μm for emission through the edge in ribbon geometry lasers, implementing guidance by gain, see J. M. Dallesasse, N. Holonyak, A. R. Sugg, T. A. Richard, and N. El Zein, Appl. Phys. Lett., 57 (1990), p. 2844.

Such selective oxidation makes the circular barrier in the InAlAs layer 26 and defines, in the center thereof, the channel facing the active zone and for passing current. The barrier is made so that the diameter c of the channel is smaller than the diameter d of the mesa.

The following steps of the method are identical to those described at e) for the first embodiment.

A component is thus obtained comprising, on a mirror 20, a stack of the following successive layers:

an n-doped InP layer 2;

an active material layer 3;

a p-doped InP layer 4, the latter two layers forming a mesa on the n-doped InP layer;

a p-doped InP layer 6 covering the mesa and the n-doped InP layer, there being a layer 26 of InAlAs comprising the circular barrier interposed therein;

a p-doped GaInAs layer 7; and a metal contact 10, with the latter two layers having a circular opening facing the mesa and containing a mirror 12, while the component also has another metal contact 18 on its bottom face.

Fifth Embodiment

Figure 5:
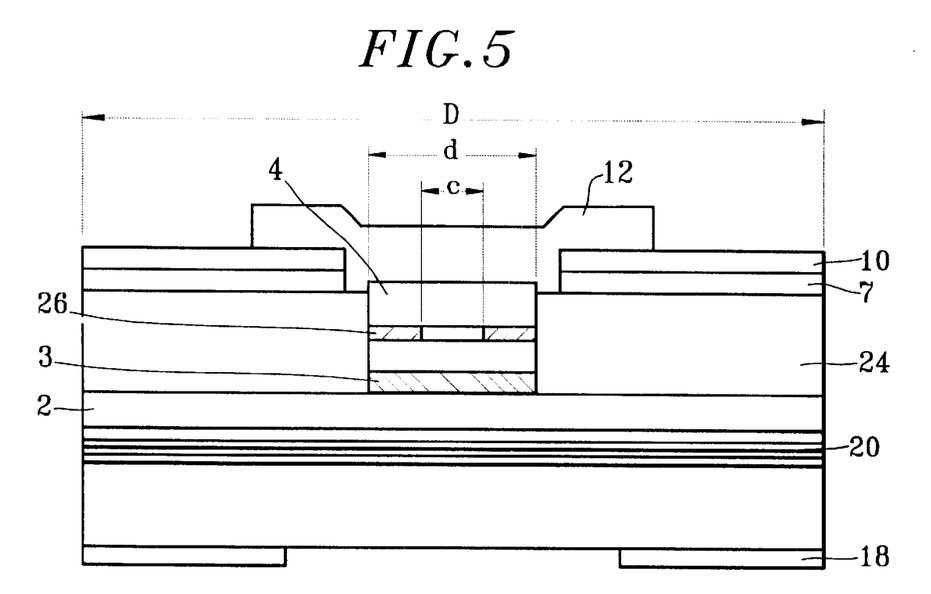
FIG. 5 is a section view of a component constituting a fifth embodiment of the invention.

The component comprising the fifth embodiment of the invention is shown in FIG. 5.

As in a) of the first embodiment, a first epitaxial growth operation is performed on a substrate or on a reflector 20 (as shown). During this operation, the following are deposited in succession: the n-doped InP layer 2; the GaInAsP layer 3; the p-doped InP layer 4 with an InAlAs layer 26 being interposed therein (i.e., as above, by depositing a first p-doped InP sublayer, then the InAlAs layer itself, and then a second p-doped InP sublayer); and finally a layer of GaInAs (not shown).

Thereafter, the GaInAs, the p-doped InP, the InAlAs, and the GaInAsP layers are etched down to the n-doped InP layer 2 to form a circular mesa as in b).

Thereafter selective oxidation of the InAlAs layer 26 is performed as explained for the fourth embodiment. This forms a circular barrier in the mesa defining a current-passing channel in the center thereof facing its injection zone and satisfying the same dimensional conditions as specified above.

After that, a regrowth mask is deposited on the mesa, covering the top of the mesa, and localized epitaxial growth is performed around the mesa to provide a p-doped InP layer 24 on the n-doped InP layer 2, followed by a p⁺-doped InGaAs layer 7 around the mesa. After that the regrowth mask is removed as is the GaInAs layer at the top of the mesa.

Thereafter the method is identical to the steps described at e) for the first embodiment.

This provides a component comprising, on a mirror 20, a stack of the following successive layers:

- an n-doped InP layer 2;
- an active material layer 3;
- a p-doped InP layer 4 in which there is interposed an InAlAs layer 26 that constitutes a circular barrier, the p-doped InP layer, the InAlAs layer, and the active material layer together forming a mesa on the n-doped InP layer;
- a p-doped InP layer 24;
- a p$^+$-doped GaInAs layer 7, with the latter two layers extending around the mesa on the n-doped InP layer; and
- a metal contact 10, the GaInAs layer and the metal contact having a circular opening facing the mesa and of a diameter greater than that of the mesa, a mirror being deposited in the opening, and the component having another metal contact 18 on its bottom face.

Sixth Embodiment

Figure 6:
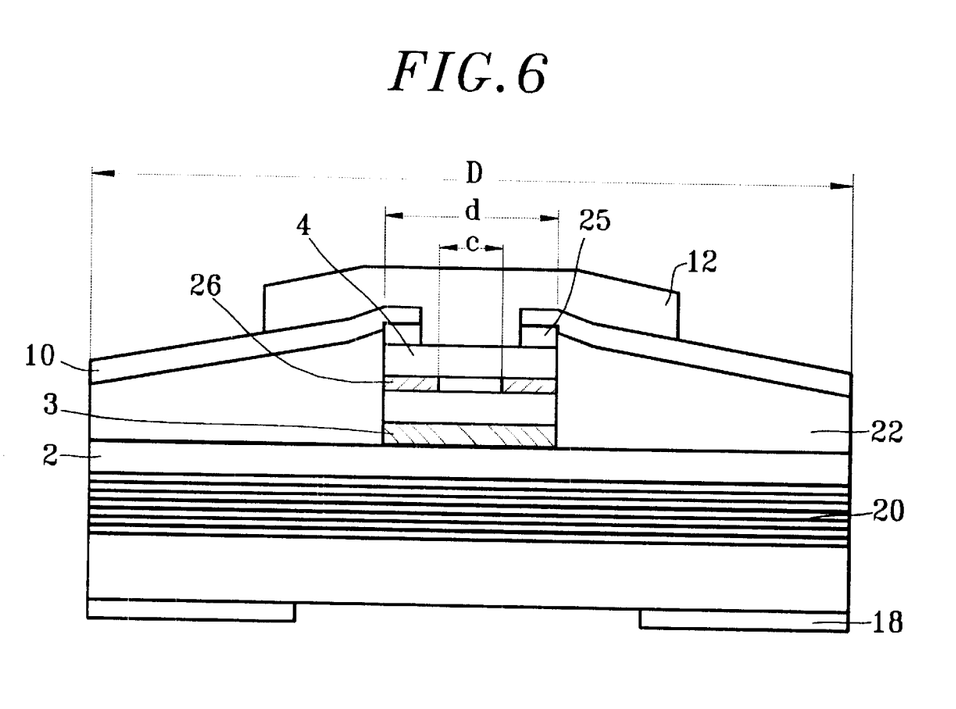
FIG. 6 is a section view of a component constituting a sixth embodiment of the invention.

FIG. 6 shows a component constituting a sixth embodiment of the invention and fabricated by a method close to that of the fifth embodiment.

The method is identical to the previous method up to and including the step of selective lateral oxidation of the InAlAs layer 26. The GaInAs layer 25 of the mesa can be seen in FIG. 6.

The step of localized epitaxial regrowth of p-doped InP is replaced in this case by depositing a layer 22 of polyimide that covers the mesa and the n-doped InP layer 2 as in the third embodiment. Thereafter, said layer 22 is subjected to reactive etching to uncover the GaInAs layer 24 of the mesa.

The method then proceeds in the same manner as the end of the third embodiment (a metal contact is deposited, an opening is made of diameter smaller than that of the mesa, . . . ) and the injection zone and the channel satisfy the same dimensional conditions as in the third embodiment.

This gives rise to a component comprising, on a mirror 20, a stack of the following successive layers:

- an n-doped InP layer 2;
- an active material layer 3;
- a p-doped InP layer 4 in which there is interposed an InAlAs layer including a circular barrier 26;
- a GaInAs layer 25, the active material layer, the p-doped InP layer, the InAlAs layer, and the GaInAs layer together forming a mesa on the n-doped InP layer;
- a polyimide layer 22 extending over the n-doped InP layer around the mesa; and
- a metal contact 10 extending over the mesa and the polyimide layer, the GaInAs layer and the metal contact having a circular opening facing the mesa and of a diameter that is smaller than that of the mesa, a mirror being deposited in the opening, the component having another metal contact 18 on its bottom face.

In each of the above components, the amplifying medium thus includes a circular barrier 8 or 26 extending facing the active material and opposing the passage of current. In its center facing the injection zone, this barrier defines a current-passing channel having a diameter c that is smaller than the diameter d of the injection zone. In addition, in all cases, the diameter d of the injection zone is smaller than the diameter D of the component.

In each of the above components, effective confinement of injection is achieved as is good distribution of the injected carriers, with the carrier density in the injection zone being greater at the center than at the sides. Modal gain is high and the threshold current is reduced, thereby making it possible to emit at a wavelength λ lying in the range 1.3 μm to 1.55 μm inclusive, at ambient temperatures of less than 30° C.

We claim:

1. A vertical-cavity surface-emitting laser component operating at a wavelength lying in the range 1.3 μm to 1.55 μm, the component comprising a layer of active material having an injection zone of width that is smaller than the width of the component, said zone emitting radiation when an electrical current is injected therein, the component also comprising an amplifying medium for amplifying the radiation and two mirrors that are reflective at the emission wavelength and disposed respectively above and below the amplifying medium, wherein the amplifying medium includes a circular barrier extending facing the active material, said barrier opposing the passage of current and defining a current-passing channel in its center facing the injection zone, said channel being of a width that is smaller than the width of the injection zone.

2. A component according to claim 1, comprising on a substrate or on a mirror, a stack of the following successive layers:

- an n-doped InP layer;
- an active material layer;
- a p-doped InP layer, the latter two layers forming a mesa on the n-doped InP layer;
- a p-doped InP layer covering the mesa and the n-doped InP layer, and including the circular barrier;
- a p-doped GaInAs layer; and
- a metal contact, the latter two layers presenting a circular opening facing the mesa and having a mirror deposited therein, the component presenting another metal contact on its bottom face.

3. A method of fabricating a component according to claim 2, comprising the steps consisting in:

- making on a substrate or on a mirror a stack comprising in succession an n-doped InP layer, an active material layer, and a p-doped InP layer;
- etching the latter two layers to form a mesa on the n-doped InP layer;
- epitaxially growing on the mesa and on the n-doped InP layer, a p-doped InP layer and then a p-doped GaInAs layer;
- depositing a photosensitive resin thereon;
- placing a mask facing the top of the mesa and having a width that is smaller than the width of the mesa;
- bombarding the component with H$^+$ ions so as to make a circular barrier in the p-doped InP layer covering the mesa;
- removing the mask;
- depositing a metal layer on the component;
- etching a circular opening that faces the mesa in the metal layer and in the GaInAs layer, and depositing a mirror in said opening; and
- depositing a metal layer on the bottom face of the component.

4. A component according to claim 1, comprising, on a substrate or on a mirror, a stack of the following successive layers:

- an n-doped InP layer;
- an active material layer;
- a p-doped InP layer, the latter two layers forming a mesa on the n-doped InP layer;

a p-doped InP layer;

a p+-doped GaInAs layer, the latter two layers extending around the mesa on the n-doped InP layer; and a metal contact, the GaInAs layer and the metal contact having a circular opening facing the mesa in which a mirror is deposited, the component having another metal contact on its bottom face, the circular barrier extending in the p-doped InP layers.

5. A method of fabricating a component according to claim 4, comprising the steps consisting in:

making on a substrate or on a mirror a stack comprising in succession an n-doped InP layer, an active material layer, a p-doped InP layer, and a GaInAs layer;

etching the latter three layers to form a mesa on the n-doped InP layer;

depositing a regrowth mask on the top of the mesa;

performing localized epitaxial growth around the mesa of a p-doped InP layer, then of a p+-doped GaInAs layer;

removing the mask;

depositing a photosensitive resin on the component;

placing a mask to face the top of the mesa and of a width that is smaller than the width of the mesa;

bombarding the component with H+ ions to form the circular barrier in the p-doped InP layers;

removing the mask;

depositing a metal layer on the component;

etching a circular opening extending facing the mesa in the metal layer and the GaInAs layer, and depositing a mirror in said opening; and depositing a metal layer on the bottom face of the component.

6. A component according to claim 1, comprising, on a substrate or on a mirror, a stack of the following successive layers:

an n-doped InP layer;

an active material layer;

a p-doped InP layer in which the circular barrier extends;

a GaInAs layer, the latter three layers forming a mesa on the n-doped InP layer;

a polyimide layer extending over the n-doped InP layer around the mesa; and a metal contact extending over the mesa and the polyimide layer, the GaInAs layer and the metal contact having a circular opening facing the mesa and of a width that is smaller than that of the mesa, a mirror being deposited therein, the component having another metal contact on its bottom face.

7. A method of fabricating a component according to claim 6, comprising the steps consisting in:

making on a substrate or a mirror a stack comprising in succession an n-doped InP layer, an active material layer, a p-doped InP layer, and a layer of GaInAs;

etching the latter three layers to form a mesa on the n-doped InP layer;

depositing a layer of polyimide to cover the mesa and the n-doped InP layer;

reactively etching the polyimide layer to uncover the top of the mesa;

depositing a photosensitive resin on the component;

depositing a mask facing the top of the mesa, the width of the mask being smaller than the width of the mesa;

bombarding the component with H+ ions so as to make a circular barrier in the p-doped InP layer;

removing the mask;

depositing a metal layer on the component;

etching a circular opening extending facing the mesa and of a width smaller than the width of the mesa in the GaInAs layer and in the metal layer, and depositing a mirror in said opening; and depositing a metal layer on the bottom face of the component.

8. A component according to claim 1, comprising, on a substrate or on a mirror, a stack of the following successive layers:

an n-doped InP layer;

an active material layer;

a p-doped InP layer, the latter two layers forming a mesa on the n-doped InP layer;

a p-doped InP layer covering the mesa and the n-doped InP layer, an InAlAs layer including the circular barrier being interposed therein;

a p-doped GaInAs layer; and a metal contact, the latter two layers presenting a circular opening facing the mesa and in which a mirror is disposed, the component also having another metal contact on its bottom face.

9. A method of fabricating a component according to claim 8, comprising the steps consisting in:

making, on a substrate or on a mirror a stack comprising in succession an n-doped InP layer, an active material layer, and a p-doped InP layer;

etching the latter two layers to form a mesa on the n-doped InP layer;

epitaxially growing a p-doped InP layer on the mesa and the n-doped InP layer, with an InAlAs layer being interposed therein, and then epitaxially growing a p-doped GaInAs layer;

etching the latter three layers at a distance from the mesa down to the n-doped InP layer;

performing selective lateral oxidation by wet chemical etching of the InAlAs layer so as to form the circular barrier therein;

depositing a metal layer on the component;

etching a circular opening that extends facing the mesa in the metal layer and the GaInAs layer, and depositing a mirror in said opening; and depositing a metal layer on the bottom face of the component.

10. A component according to claim 1, including, on a substrate or a mirror, a stack of the following successive layers:

an n-doped InP layer;

an active material layer;

a p-doped InP layer in which an InAlAs layer including the circular barrier is interposed, the p-doped InP layer, the InAlAs layer, and the active material layer forming a mesa on the n-doped InP layer;

a p-doped InP layer;

a p+-doped GaInAs layer, the latter two layers extending around the mesa on the n-doped InP layer; and a metal contact, the GaInAs layer and the metal contact having a circular opening facing the mesa and in which a mirror is despoiled, the component having another metal contact on its bottom face.

11. A method of fabricating a component according to claim 10, comprising the steps consisting in:

making, on a substrate or on a mirror, a stack comprising in succession an n-doped InP layer, an active material layer, a p-doped InP layer having an InAlAs layer interposed therein, and a GaInAs layer;

etching the last four layers to form a mesa on the n-doped InP layer;

performing selective lateral oxidation by wet chemical etching of the InAlAs layer so as to form the circular barrier therein;

depositing a regrowth mask to cover the top of the mesa;

performing localized epitaxial growth around the mesa of a layer of semi-insulating InP, and then of a layer of p$^+$-doped GaInAs;

removing the mask and the layer of GaInAs from the mesa;

etching a circular opening extending facing the mesa in the metal layer and in the GaInAs layer, and depositing a mirror in said opening; and depositing a metal layer on the bottom face of the component.

12. A component according to claim 1, including, on a substrate or a mirror, a stack of the following successive layers:

an n-doped InP layer;

an active material layer;

a p-doped InP layer having an InAlAs layer including the circular barrier interposed therein;

a GaInAs layer, the active material layer, the p-doped InP layer, the InAlAs layer, and the GaInAs layer forming a mesa on the n-doped InP layer;

a polyimide layer extending over the n-doped InP layer around the mesa; and a metal contact extending over the mesa and the polyimide layer, the GaInAs layer and the metal contact having a circular opening facing the mesa and of a width that is smaller than that of the mesa, a mirror being deposited therein, the component having another metal contact on its bottom face.

13. A method of fabricating a component according to claim 12, comprising the steps consisting in:

making, on a substrate or on a mirror, a stack comprising in succession an n-doped InP layer, an active material layer, a p-doped InP layer having an InAlAs layer interposed therein, and a GaInAs layer;

etching the latter four layers to form a mesa on the n-doped InP layer;

performing selective lateral oxidation by wet chemical etching of the InAlAs layer to form the circular barrier therein;

depositing a polyimide layer to cover the mesa and the n-doped InP layer;

performing reactive etching of the polyimide layer to uncover the top of the mesa;

depositing a metal layer on the component;

etching a circular opening extending facing the mesa in the GaInAs layer and in the metal layer, the width of the opening being smaller than the width of the mesa, and depositing a mirror in said opening; and depositing a metal layer on the bottom face of the component.

14. A component according to claim 1, wherein the stack is deposited on an n-doped InP substrate, a metal contact extending over the bottom face of said substrate, the substrate having a cavity whose end wall extends facing the active material and in the vicinity thereof, a mirror being deposited in said cavity.

15. A component according to claim 1, wherein the stack is deposited on a semiconductor mirror, a metal contact extending over the bottom face of said mirror.

* * * * *